(12) United States Patent
Liu et al.

(10) Patent No.: US 11,005,063 B2
(45) Date of Patent: May 11, 2021

(54) DISPLAY SUBSTRATE HAVING MICROCAVITIES

(71) Applicant: BOE TECHNOLOGY GROUP CO., LTD., Beijing (CN)

(72) Inventors: Li Liu, Beijing (CN); Xiaochuan Chen, Beijing (CN); Shengji Yang, Beijing (CN); Kuanta Huang, Beijing (CN); Pengcheng Lu, Beijing (CN); Yongfa Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/830,087

(22) Filed: Mar. 25, 2020

(65) Prior Publication Data

US 2021/0098748 A1  Apr. 1, 2021

(30) Foreign Application Priority Data

Sep. 27, 2019  (CN) .......................... 201910926325.5

(51) Int. Cl.
*H01L 33/00* (2010.01)
*H01L 51/52* (2006.01)
*H01L 51/56* (2006.01)
*H01L 27/32* (2006.01)

(52) U.S. Cl.
CPC ...... *H01L 51/5218* (2013.01); *H01L 27/3211* (2013.01); *H01L 27/3218* (2013.01); *H01L 51/5215* (2013.01); *H01L 51/5265* (2013.01); *H01L 51/5271* (2013.01); *H01L 51/56* (2013.01)

(58) Field of Classification Search
CPC . H01L 51/56; H01L 27/3218; H01L 51/5218; H01L 51/5271; H01L 51/5265; H01L 27/3211; H01L 51/5215
See application file for complete search history.

(56) References Cited

U.S. PATENT DOCUMENTS

| | | | | |
|---|---|---|---|---|
| 9,425,245 | B2* | 8/2016 | Song | ................. H01L 51/56 |
| 9,583,734 | B2* | 2/2017 | Shim | ................. H01L 51/5265 |
| 10,135,032 | B2* | 11/2018 | Aiba | ................. H01L 51/5265 |
| 2007/0015429 | A1* | 1/2007 | Maeda | ................. H01L 51/5206 |
| | | | | 445/24 |

* cited by examiner

*Primary Examiner* — Shouxiang Hu
(74) *Attorney, Agent, or Firm* — Kinney & Lange, P.A.

(57) ABSTRACT

A display substrate and a method for manufacturing the same are provided. The display substrate includes: a base substrate; a first-color sub-pixel region and a second-color sub-pixel region on the base substrate. The first-color sub-pixel region includes: a first reflective layer, a first isolation layer and a first anode layer, the first reflective layer and the first anode layer being electrically connected with each other through a first connection element which penetrates through the first isolation layer. The second-color sub-pixel region includes: a second reflective layer, a second isolation layer and a second anode layer, the second reflective layer and the second anode layer being electrically connected with each other through a second connection element which penetrates through the second isolation layer. Thicknesses of the first isolation layer and the second isolation layer are different.

11 Claims, 11 Drawing Sheets

S130 opening a first connection hole in the first isolation layer, a second connection hole in the second isolation layer (a third connection hole in the third isolation layer through a single patterning process) — S131 forming a first connection element in the first connection hole, forming a second connection element in the second connection hole (forming a third connection element in the third connection hole through a single patterning process) — S132

FIG. 3D

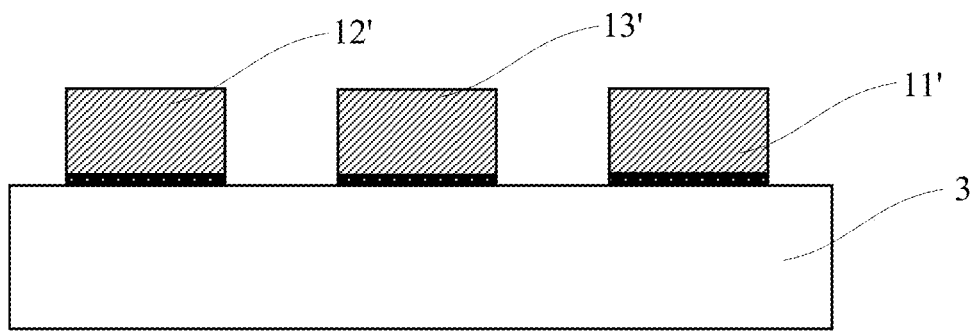

FIG. 4A

DISPLAY SUBSTRATE HAVING MICROCAVITIES

CROSS-REFERENCE TO RELATED APPLICATION

This application claims the benefit of Chinese Patent Application No. 201910926325.5 filed on Sep. 27, 2019 with the China National Intellectual Property Administration, the disclosure of which is incorporated in entirety herein by reference.

TECHNICAL FIELD

The present disclosure relates to the field of display technologies, and in particular, to a display substrate and the method for manufacturing the same.

BACKGROUND

OLED (Organic Light-Emitting Diodes) display technology, as a new type of display technology, has been widely used in the fields including smart watches, mobile phones, tablet computers, displays and the like. The silicon-based OLED displays, in which the single-crystal silicon wafer is used as the active drive backplane, have excellent characteristics such as high pixel density, high integration, small size, ease of carrying, high vibration-resistance, and ultra-low power consumption, and thus became one of the hot spots in the research on display technology.

However, one of the technical problems to be solved in the art is how to further improve the display brightness of the silicon-based OLEDs.

SUMMARY

An embodiment of the present disclosure provides a display substrate including: a base substrate; a first-color sub-pixel region and a second-color sub-pixel region provided on the base substrate; wherein the first-color sub-pixel region includes: a first reflective layer, a first isolation layer on a side of the first reflective layer distal to the base substrate, and a first anode layer on a side of the first isolation layer distal to the base substrate, the first reflective layer and the first anode layer being electrically connected with each other through a first connection element which penetrates through the first isolation layer; wherein the second-color sub-pixel region includes: a second reflective layer, a second isolation layer on a side of the second reflective layer distal to the base substrate, and a second anode layer on a side of the second isolation layer distal to the base substrate, the second reflective layer and the second anode layer being electrically connected with each other through a second connection element which penetrates through the second isolation layer; and wherein thicknesses of the first isolation layer and the second isolation layer are different.

In some embodiments, thicknesses of the first reflective layer and the second reflective layer are different.

In some embodiments, a surface of the first isolation layer distal to the first reflective layer and a surface of the second isolation layer distal to the second reflective layer are flush with each other.

In some embodiments, the display substrate further includes a third-color sub-pixel region on the base substrate, wherein the third-color sub-pixel region includes a third reflective layer, a third isolation layer on a side of the third reflective layer distal to the base substrate, and a third anode layer on a side of the third isolation layer distal to the base substrate, the third reflective layer and the third anode layer being electrically connected with each other through a third connection element which penetrates through the third isolation layer; and wherein thicknesses of any two of the first isolation layer, the second isolation layer and the third isolation layer are not equal to each other.

In some embodiments, a thickness of the first isolation layer is 1500 to 20500 Angstroms, a thickness of the second isolation layer is 1000 to 20000 Angstroms, and a thickness of the third isolation layer is 500 to 19500 Angstroms.

In some embodiments, thicknesses of any two of the first reflective layer, the second reflective layer and the third reflective layer are different from each other.

In some embodiments, any two of a sum of thicknesses of the first isolation layer and the first reflective layer, a sum of thicknesses of the second isolation layer and the second reflective layer and a sum of thicknesses of the third isolation layer and the third reflective layer are equal.

In some embodiments, a thickness of the first reflective layer is 4000 to 22500 Angstroms, a thickness of the second reflective layer is 4500 to 23000 Angstroms, and a thickness of the third reflective layer is 5000 to 23500 Angstroms.

In some embodiments, the first reflective layer and the second reflective layer each includes a protective sub-layer and a reflective sub-layer that are stacked, and the reflective sub-layer is located on a side of the protective sub-layer distal to the base substrate.

In some embodiments, the protective sub-layer is made of titanium metal, and the reflective sub-layer is made of aluminum metal.

In some embodiments, the first anode layer and the second anode layer are made of indium tin oxide.

An embodiment of the present disclosure also provides a method of manufacturing a display substrate, including: forming a first reflective layer in a first-color sub-pixel region on a base substrate and forming a second reflective layer in a second-color sub-pixel region on the base substrate; forming a first isolation layer on a side of the first reflective layer distal to the base substrate and forming a second isolation layer on a side of the second reflective layer distal to the base substrate, wherein the first isolation layer and the second isolation layer have different thicknesses; forming a first connection element, which penetrates through the first isolation layer, on a side of the first reflective layer distal to the base substrate, and forming a second connection element, which penetrates through the second isolation layer, on a side of the second reflective layer distal to the base substrate; and forming a first anode layer on a side of the first isolation layer distal to the base substrate and forming a second anode layer on a side of the second isolation layer distal to the base substrate, wherein the first anode layer is electrically connected to the first reflective layer through the first connection element, and the second anode layer is electrically connected to the second reflective layer through the second connection element.

In some embodiments, the step of forming the first reflective layer in the first-color sub-pixel region on the base substrate and forming the second reflective layer in the second-color sub-pixel region on the base substrate includes: forming a first initial reflective layer in the first-color sub-pixel region on the base substrate and forming a second initial reflective layer in the second-color sub-pixel region on the base substrate; forming an initial isolation layer on the base substrate on which the first initial reflective layer and the second initial reflective layer are formed, wherein the initial isolation layer covers the first initial reflective layer and the second initial reflective layer on a side of the first initial reflective layer and the second initial reflective layer distal to the base substrate; and etching the initial isolation layer and the first initial reflective layer from a side of the initial isolation layer distal to the first initial reflective layer to form the first reflective layer.

In some embodiments, the step of forming the first reflective layer in the first-color sub-pixel region on the base substrate and forming the second reflective layer in the second-color sub-pixel region on the base substrate further includes: etching the initial isolation layer and the second initial reflective layer from a side of the initial isolation layer distal to the second initial reflective layer to form the second reflective layer, wherein, an etching depth of the second initial reflective layer is different from an etching depth of the first initial reflective layer.

In some embodiments, the step of forming the first isolation layer on the side of the first reflective layer distal to the base substrate and forming the second isolation layer on the side of the second reflective layer distal to the base substrate includes: forming the first isolation layer in an etched groove on a side of the first reflective layer distal to the base substrate and forming the second isolation layer in an etched groove on a side of the second reflective layer distal to the base substrate.

In some embodiments, after the step of forming the first isolation layer on the side of the first reflective layer distal to the base substrate, and forming the second isolation layer on the side of the second reflective layer distal to the base substrate, and before the step of forming the first anode layer on the side of the first isolation layer distal to the base substrate and forming the second anode layer on the side of the second isolation layer distal to the base substrate, the method further including: flattening surfaces of the first isolation layer and the second isolation layer distal to the base substrate to make the surface of the first isolation layer distal to the base substrate and the surface of the second isolation layer distal to the base substrate flush with each other.

In some embodiments, the method further including: forming a third reflective layer in a third-color sub-pixel region on the base substrate; forming a third isolation layer on a side of the third reflective layer distal to the base substrate, wherein the third isolation layer has a thickness different from a thickness of the first isolation layer and a thickness of the second isolation layer; forming a third connection element, which penetrates through the third isolation layer, on a side of the third reflective layer distal to the base substrate; and forming a third anode layer on a side of the third isolation layer distal to the base substrate, wherein the third anode layer is electrically connected to the third reflective layer through the third connection element.

In some embodiments, the steps of forming the first connection element, which penetrates through the first isolation layer, on the side of the first reflective layer distal to the base substrate, forming the second connection element, which penetrates through the second isolation layer, on the side of the second reflective layer distal to the base substrate, and forming the third connection element, which penetrates through the third isolation layer, on the side of the third reflective layer distal to the base substrate include: opening a first connection hole in the first isolation layer, a second connection hole in the second isolation layer, and a third connection hole in the third isolation layer through a single patterning process; and forming the first connection element in the first connection hole, the second connection element in the second connection hole, and the third connection element in the third connection hole through a single patterning process.

In some embodiments, the step of forming the first anode layer on the side of the first isolation layer distal to the base substrate and forming the second anode layer on the side of the second isolation layer distal to the base substrate, and the step of forming the third anode layer on the side of the third isolation layer distal to the base substrate include: forming the first anode layer on the first isolation layer, the second anode layer on the second isolation layer, and the third anode layer on the third isolation layer through a single patterning process.

In some embodiments, an orthographic projection of the first anode layer on the base substrate is located within an orthographic projection of the first reflective layer on the base substrate, and an orthographic projection of the second anode layer on the base substrate is located within an orthographic projection of the second reflective layer on the base substrate.

BRIEF DESCRIPTION OF THE DRAWINGS

FIG. 3D is a schematic flowchart of step S130 in FIG. 3A;

FIG. 4A-FIG. 4L illustrate a flowchart of a method of manufacturing a display substrate according to an exemplary embodiment of the present application.

DETAILED DESCRIPTION OF EMBODIMENTS

Figure 1:
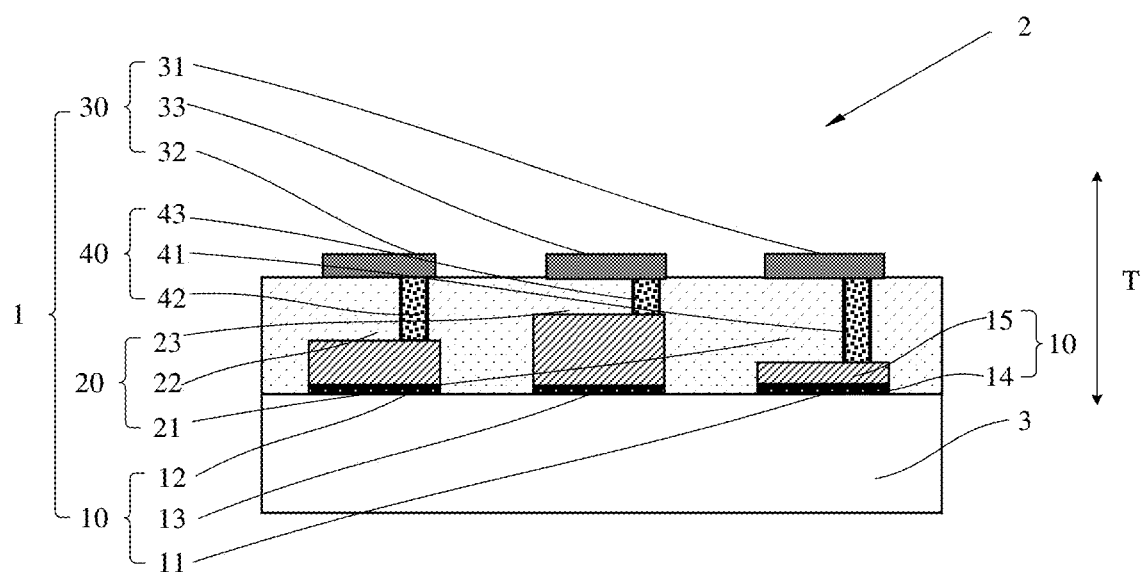
FIG. 1 schematically illustrates a cross-sectional view of a display substrate according to an exemplary embodiment of the present application.

Exemplary embodiments will be described in detail herein, examples of which are illustrated in the drawings. When the following description refers to the drawings, unless otherwise indicated, like numerals in different drawings indicate the same or similar elements. The embodiments described in the following exemplary embodiments do not represent all of the embodiments which are consistent with the present disclosure. Instead, they are merely examples of devices consistent with some aspects of the disclosure as detailed in the appended claims.

The terms used in this application is for the purpose of describing particular embodiments merely and is not intended to limit the application. Unless otherwise defined, technical terms or scientific terms used in the present disclosure are intended to be understood as having the ordinary meaning for those skilled in the art. The words "a" or "an" and the like used in the specification and claims of this application do not indicate a limitation on quantity, but rather indicate that there is at least one. The words "include" or "comprise" or and the like mean that the elements or items before the words "include" or "comprise" encompass the elements or items listed after the words "include" or "comprise" and their equivalents, and do not exclude other elements or items. The word "connect" or "couple" and the like are not limited to physical or mechanical connections, but may include electrical connections, including direct or indirect connections. The expression "a plurality of" includes two, which is equivalent to "at least two". The singular forms "a" "the" and "said" used in this specification and the appended claims are intended to include the plural forms as well, unless the context clearly indicates otherwise. It should also be understood that the term "and/or" as used herein refers to and includes any or all possible combinations of one or more of the associated listed items.

Figure 5:
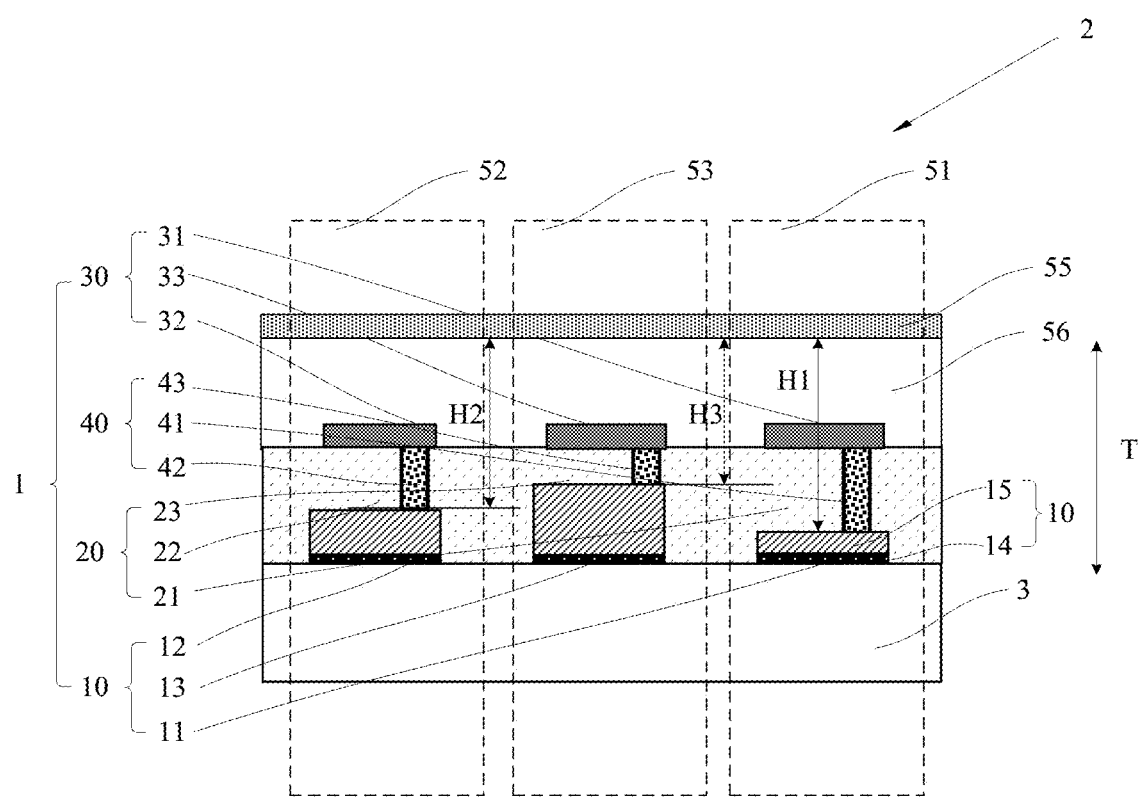
FIG. 5 schematically illustrates an example of a micro-cavity structure on a display substrate.

FIG. 1 schematically illustrates a cross-sectional view of a display substrate according to an exemplary embodiment of the present application, in which a composite anode structure 1 for a microcavity is shown. First, the microcavity used in OLED is introduced as below. Referring to FIG. 5, it illustrates sub-pixel units of three different colors, which correspond to the first-color sub-pixel region 51, the second-color sub-pixel region 52, and the third-color sub-pixel region 53 respectively. The structure of the first-color sub-pixel region 51 will now be described as an example. The microcavity structure is mainly formed by a cathode layer 55, a first anode layer 31, and a first reflective layer 11 electrically connected to the first anode layer 31. By applying a voltage between the cathode layer 55 and the first anode layer 31, the light-emitting material layer 56 located between the cathode layer 55 and the first anode layer 31 can be driven to emit light. The emitted light can be reflected by the first reflective layer 11 to the cathode layer 55 through the first anode layer 31 (usually the anode layer is transparent). By arranging the distance H1 (or referred to as the cavity length of the microcavity) between the first reflective layer 11 and the cathode layer 55 to meet a certain relationship (for example, $H1=m*\lambda/2$, where m is a natural number, $\lambda$, is the wavelength of the light emitted from the first-color sub-pixel region 51) with the emitted wavelength, the light interference effect of corresponding color may be enhanced, thereby increasing the brightness. Since the cavity length of the microcavity depends on the wavelength of the emitted light, the distance between the reflective layer and the cathode layer is different depending on the sub-pixel regions of different colors. As can be seen from the example in FIG. 5, the distance H1 between the first reflective layer 11 and the cathode layer 55 in the first-color sub-pixel region 51 is greater than the distance H2 between the second reflective layer 12 and the cathode layer 55 in the second-color sub-pixel region 52. The distance H2 between the second reflective layer 12 and the cathode layer 55 in the second-color sub-pixel region 52 is greater than the distance H3 between the third reflective layer 13 and the cathode layer 55 in the third-color sub-pixel region 53. Accordingly, the wavelength of the emitted light corresponding to the first-color sub-pixel region 51 is greater than the wavelength of the emitted light corresponding to the second-color sub-pixel region 52, and the wavelength of the emitted light corresponding to the second-color sub-pixel region 52 is greater than the wavelength of the emitted light corresponding to the third-color sub-pixel region 53.

It can be seen from the above that a composite anode structure 1 is used in the microcavity structure. The composite anode structure is composed of the reflective layer 10 and the anode layer 30 as well as the isolation layer 20 located between the reflective layer 10 and the anode layer 30.

In some embodiments, the display substrate 2 includes, along a thickness direction T, a base substrate 3 and a microcavity anode structure 1 disposed on the base substrate 3. Here, the base substrate 3 is not limited. In the display substrate 2 of the silicon-based OLED, the base substrate 3 may be a wafer. In the display substrate 2 of the OLED, the base substrate 3 may also be formed by a film layer of a thin film diode.

In some embodiments, as shown in FIG. 1, the display substrate 2 may include: a base substrate 3; and a first-color sub-pixel region 51 and a second-color sub-pixel region 52 disposed on the base substrate 3. The first-color sub-pixel region 51 is provided with a first reflective layer 11, a first isolation layer 21 located on a side of the first reflective layer 11 distal to the base substrate 3, and a first anode layer 31 located on a side of the first isolation layer 21 distal to the base substrate 3. The first reflective layer 11 and the first anode layer 31 are electrically connected to each other through a first connection element 41. The first connection element 41 is arranged to penetrate through the first isolation layer 21, and may be of a via hole structure, for example. Similarly, the second-color sub-pixel region 51 includes a second reflective layer 12, a second isolation layer 22 located on a side of the second reflective layer 12 distal to the base substrate 3, and a second anode layer 32 located on a side of the second isolation layer 22 distal to the base substrate 3. The second reflective layer 12 and the second anode layer 32 are electrically connected to each other through a second connection element 42. The second connection element 42 is arranged to penetrate through the second isolation layer 22, and may be of a via hole structure, for example.

The thicknesses of the first isolation layer 21 and the second isolation layer 22 may be different. The thickness difference between the first isolation layer 21 and the second isolation layer 22 can be used to adjust the cavity length of the microcavities in the first-color sub-pixel region 51 and the second-color sub-pixel region 52, thereby achieving the effect of increasing display brightness. That is, the different portions of the isolation layer 20 below the anode layer 30 corresponding respectively to the sub-pixels of different colors have different thickness, thereby optimizing the structural parameters of the microcavity to improve display brightness.

In some embodiments, the first reflective layer 11 and the second reflective layer 12 may have different thicknesses. Due to the thickness difference between the first reflective layer 11 and the second reflective layer 12, the distance between the cathode layer and the reflective layer for different sub-pixel regions of different colors may be different, which is advantageous for simplifying the process.

In some embodiments, the display substrate 2 may further include a third-color sub-pixel region 53 disposed on the base substrate 3. The third-color sub-pixel region 53 is provided with a third reflective layer 13, a third isolation layer 23 located on a side of the third reflective layer 13 distal to the base substrate 3, and a third anode layer 33 located on a side of the third isolation layer 23 distal to the base substrate 3. The third reflective layer 13 and the third anode layer 33 are electrically connected to each other through a third connection element 43. The third connection element 43 may be arranged to penetrate through the third isolation layer 23, and may be of a via hole structure, for example. The thicknesses of the first isolation layer 21, the second isolation layer 22, and the third isolation layer 23 may be different from each other. As an example, the thickness of the first isolation layer 21 is 1500 to 20500 Angstroms; the thickness of the second isolation layer 22 is 1000 to 20000 Angstroms; and the thickness of the third isolation layer 23 is 500 to 19500 Angstroms. The material of the isolation layer 20 is, for example, silicon oxide.

In the embodiment of the present disclosure, the first reflective layer 11, the second reflective layer 12, and the third reflective layer 13 may be collectively referred to as the reflective layer 10; the first isolation layer 21, the second isolation layer 22, and the third isolation layer 23 may be collectively referred to as the isolation layer 20; the first anode layer 31, the second anode layer 32, and the third anode layer 33 may be collectively referred to as the anode layer 30; and the first connection element 41, the second connection element 42, and the third connection element 43 may be collectively referred to as the connection element 40.

In some embodiments, portions of the reflective layer 10 that correspond respectively to the sub-pixels of different colors have different thicknesses. That is, any two of the thicknesses of the first reflective layer 11, the second reflective layer 12, and the third reflective layer 13 are different.

Figure 2:
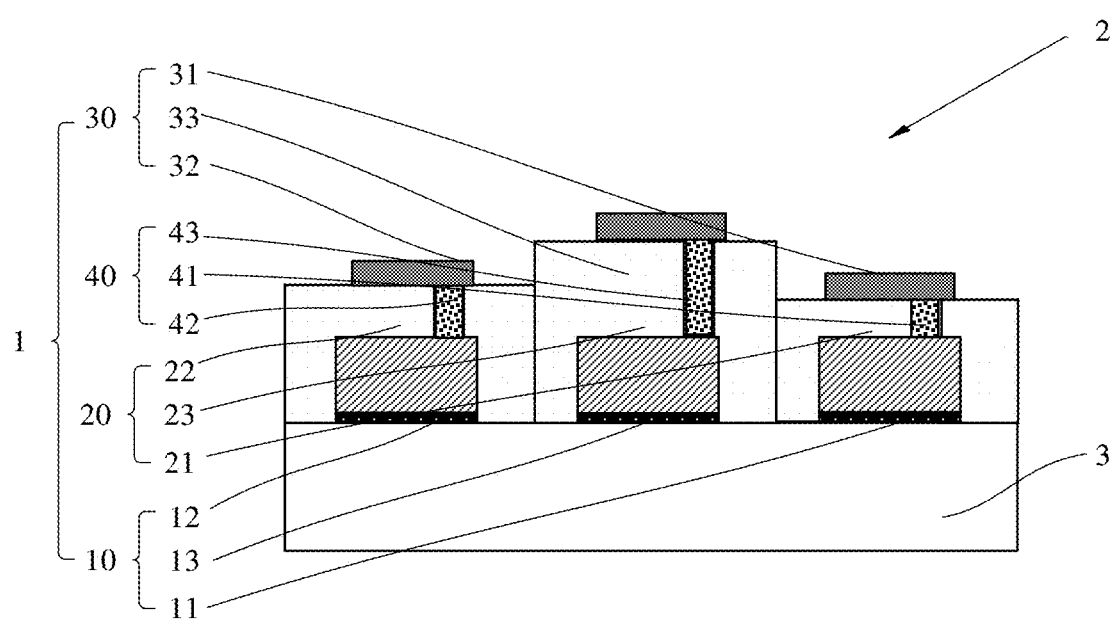
FIG. 2 schematically illustrates a cross-sectional view of a display substrate according to another exemplary embodiment of the present application.

However, the embodiments of the present disclosure are not limited thereto. For example, in other embodiments, as shown in FIG. 2, the thicknesses of the first reflective layer 11, the second reflective layer 12, and the third reflective layer 13 may also be equal, so that the surface of the first isolation layer 21, the surface of the second isolation layer 22, and the surface of the third isolation layer 23 distal to the reflective layer 10 are not in the same plane, but form a concave-convex surface.

In some embodiments, the sum of the thicknesses of the first isolation layer 21 and the first reflective layer 11, the sum of the thicknesses of the second isolation layer 22 and the second reflective layer 12, and the sum of the third isolation layer 23 and the third reflective layer 13 may be equal, thereby simplifying the manufacturing process.

In some embodiments, the surface of the isolation layer 20 (for example, including the first isolation layer 21, the second isolation layer 22, the third isolation layer 23) distal to the reflective layer 10 is flush. By making the surface of the isolation layer 20 distal to the reflective layer 10 flush, it is possible to avoid breakage of subsequent organic material due to the large height difference of the film, thereby improving the yield of the product and ensuring the quality. Moreover, such a flush surface of the isolation layer 20 is also helpful for simplifying the manufacturing process.

In some embodiments, the thickness of the first reflective layer 11 is 4000 to 22500 Angstroms; the thickness of the second reflective layer 12 is 4500 to 23000 Angstroms; and the thickness of the third reflective layer 13 is 5000 to 23500 Angstroms. The sum of the thicknesses of the first isolation layer 21 and the first reflective layer 11, the sum of the thicknesses of the second isolation layer 22 and the second reflective layer 12, and the sum of the third isolation layer 23 and the third reflective layer 13 are equal.

It should be noted here that in different display substrates 2, according to different organic light emitting devices, the first sub-pixel region 51, the second sub-pixel region 52, and the third sub-pixel region 53 correspond to different colors. As an example, the first sub-pixel region 51 corresponds to a red (R) color, the second sub-pixel region 52 corresponds to a green (G) color, and the third sub-pixel region 53 corresponds to a blue (B) color. The relative positions of the first sub-pixel region 51, the second sub-pixel region 52, and the third sub-pixel region 53 on the display substrate 2 can be set according to actual needs. The examples given in the drawings are only schematic.

In some embodiments, the reflective layer 10 (for example, any one of the first reflective layer 11, the second reflective layer 12, and the third reflective layer 13) includes a protective sub-layer 14 and a reflective sub-layer 15 that are stacked. The reflective sub-layer 15 is disposed closer to the isolation layer 20. The material of the protective sub-layer 14 is titanium metal, while the material of the reflective sub-layer 15 is aluminum metal. The reason why the material of the reflective sub-layer 15 is aluminum metal lies in that, on the one hand, aluminum metal has better reflection performance, and on the other hand, the cost of aluminum metal is lower. The protective sub-layer 14 is formed by titanium metal to protect the reflective sub-layer 15 and avoid the function of the overall structure from being affected due to the migration of aluminum metal. In other embodiments, the protective sub-layer 14 includes a two-layer structure, including a first material layer and a second material layer. The material of the first material layer is titanium metal, and the material of the second material layer is titanium nitride. The second material layer is located between the first material layer and the reflective sub-layer 15 in the thickness direction T.

In some embodiments, the material of the anode layer 30 may be a transparent material. The material of the anode layer 30 is, for example, indium tin oxide. As an example, the thickness of the anode layer 30 may be 100 to 2000 Angstroms. The orthographic projection of the anode layer 30 (e.g., the first anode layer 31, the second anode layer 32, the third anode layer 33) on the base substrate 3 may be located in the orthographic projection of the corresponding reflective layer 10 (e.g., correspondingly, the first reflective layer 11, the second reflective layer 12, the third reflective layer 13) on the base substrate 3.

In the microcavity anode structure of this embodiment, the isolation layers with different thicknesses are formed under the transparent anode layers, whereby the effects of enhancing the intensity of the emitted light and increasing the display brightness may be realized.

Figure 3A:
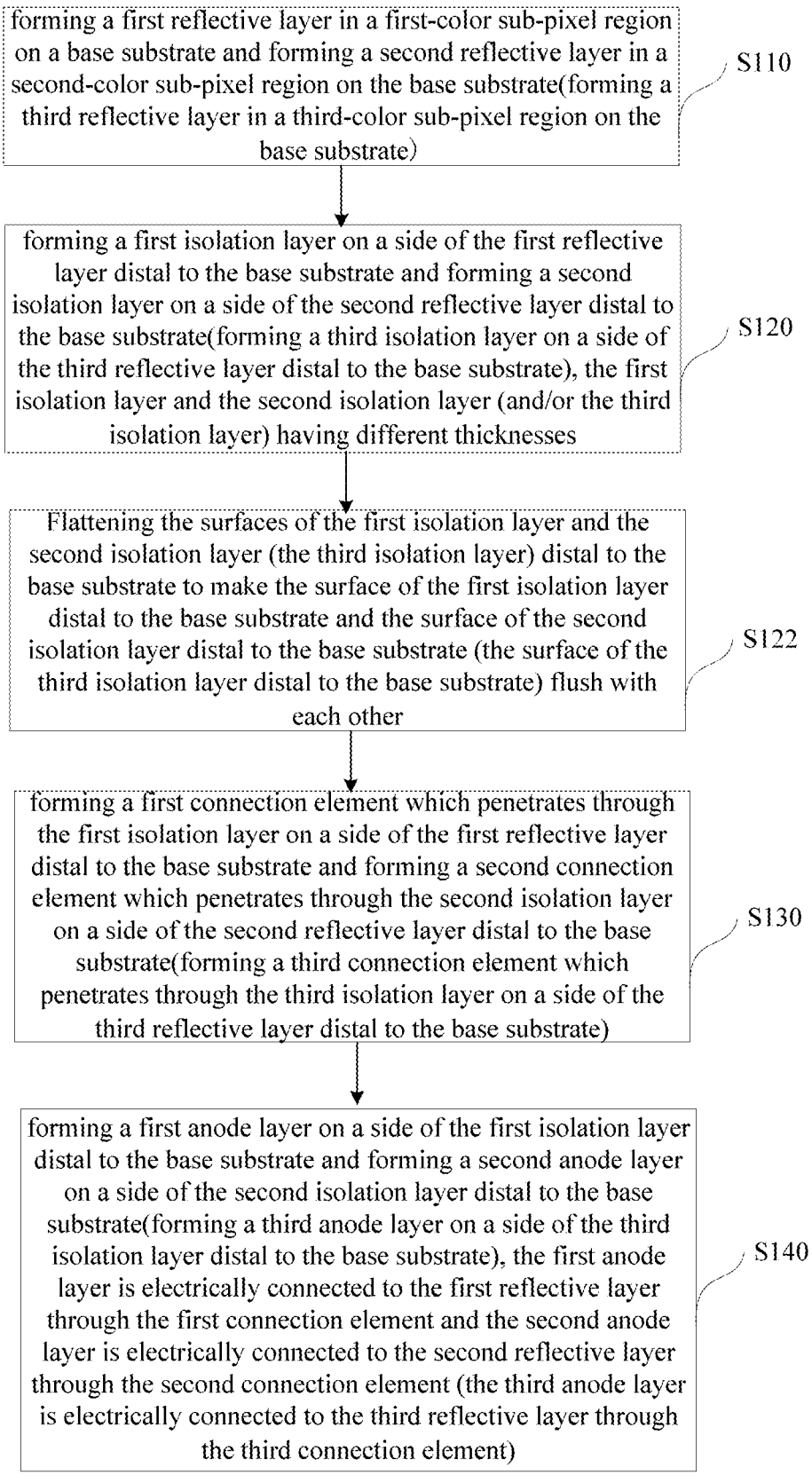
FIG. 3A is a flowchart of a method of manufacturing a display substrate according to an exemplary embodiment of the present application.

The embodiment of the present application also provides a method of manufacturing the display substrate 2, as shown in FIG. 3A to FIG. 3D, and FIG. 4A to FIG. 4L. As shown in FIG. 3A, the method includes:

Step S110: forming a first reflective layer in a first-color sub-pixel region on a base substrate and forming a second reflective layer in a second-color sub-pixel region on the base substrate;

Step S120: forming a first isolation layer on a side of the first reflective layer distal to the base substrate, and forming a second isolation layer on a side of the second reflective layer distal to the base substrate, the first isolation layer and the second isolation layer having different thicknesses;

Step S130: forming a first connection element, which penetrates through the first isolation layer, on a side of the first reflective layer distal to the base substrate, and forming a second connection element, which penetrates through the second isolation layer, on a side of the second reflective layer distal to the base substrate; and Step S140: forming a first anode layer on a side of the first isolation layer distal to the base substrate and forming a second anode layer on a side of the second isolation layer distal to the base substrate, wherein the first anode layer is electrically connected to the first reflective layer through the first connection element, and the second anode layer is electrically connected to the second reflective layer through the second connection element.

In step S110, as shown in FIG. 4A to FIG. 4E, a reflective layer 10 is formed on the base substrate 3. The reflective layer 10 may include a first reflective layer 11 located in a predetermined first-color sub-pixel region and a second reflective layer 12 located in a predetermined second-color sub-pixel region, and may further include, for example, a third reflective layer 13 located in a predetermined third-color sub-pixel region. The reflective layer 10 (for example, each of the first reflective layer 11, the second reflective layer 12, and/or the third reflective layer 13) includes a protective sub-layer 14 and a reflective sub-layer 15 that are stacked. The reflective layer 15 is disposed close to the isolation layer 20. The material of the protective sub-layer 14 is, for example, titanium metal, while the material of the reflective sub-layer 15 is, for example, aluminum metal. The reason why the material of the reflective sub-layer 15 is aluminum metal lies in that, on the one hand, aluminum metal has good reflection performance, and on the other hand, the cost of aluminum metal is lower. The protective sub-layer 14 is formed by titanium metal to protect the reflective sub-layer 15 and prevent the function of the overall structure from being affected due to the migration of aluminum metal. The thickness of the reflective layer 10 is, for example, 5000 to 23500 Angstroms, while the thickness of the protective sub-layer 14 is, for example, 50 to 500 Angstroms.

The reflective layer 10 shown in FIG. 4A is actually an initial reflective layer, which, for example, may include a first initial reflective layer 11' located in a predetermined first-color sub-pixel region, a second initial reflective layer 12' located in a predetermined second-color sub-pixel region, and a third initial reflective layer 13' located in a predetermined third-color sub-pixel region. The first initial reflective layer 11', the second initial reflective layer 12', and the third initial reflective layer 13' can be formed by single patterning process, for example. In the stage shown in FIG. 4A, the thicknesses of the first initial reflective layer 11', the second initial reflective layer 12' and the third initial reflective layer 13' may be substantially same. As mentioned above, the final thicknesses of the first reflective layer 11, the second reflective layer 12, and the third reflective layer 13 that are required should be different, so that further processing is required to form the final reflective layers.

Figure 3B:
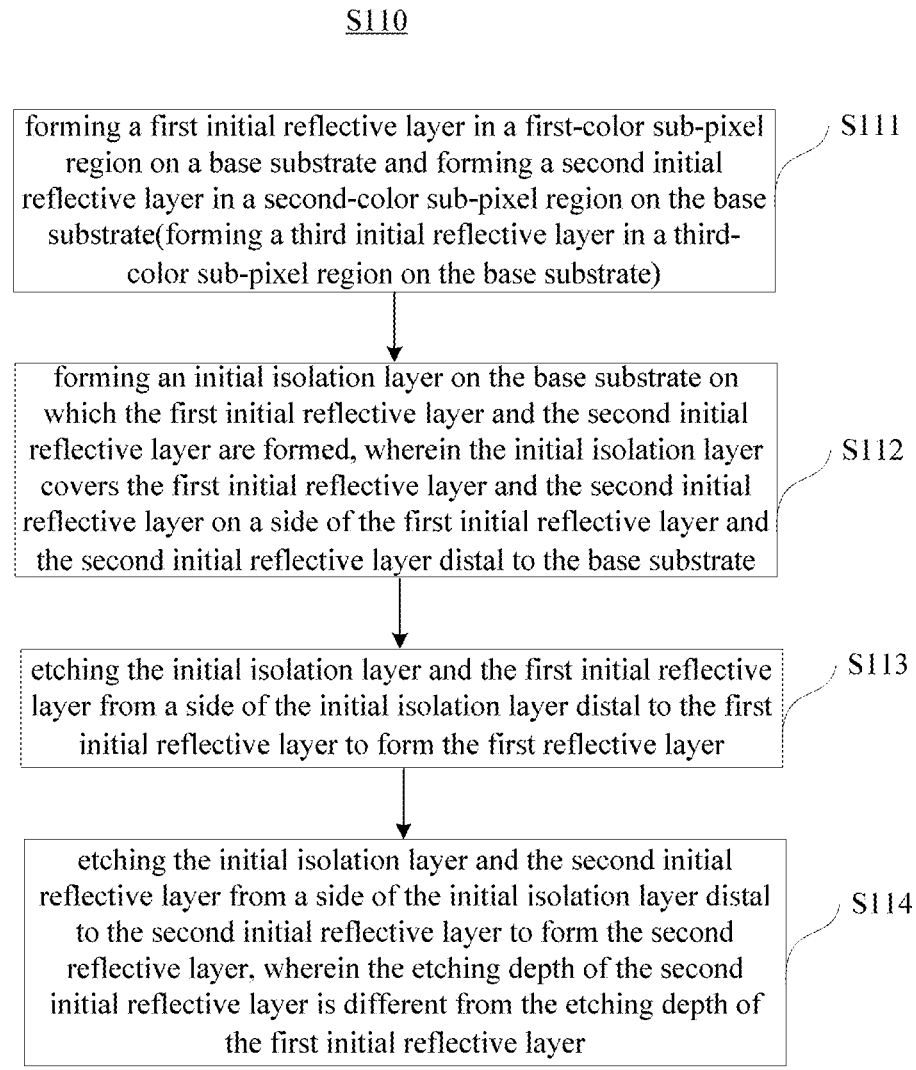
FIG. 3B is a schematic flowchart of step S110 in FIG. 3A.

In some embodiments, as shown in FIG. 3B, step S110 may include:

Step S111: forming a first initial reflective layer in a first-color sub-pixel region on a base substrate and forming a second initial reflective layer in a second-color sub-pixel region on the base substrate;

Step S112: forming an initial isolation layer on the base substrate on which the first initial reflective layer and the second initial reflective layer are formed, wherein the initial isolation layer covers the first initial reflective layer and the second initial reflective layer on a side of the first initial reflective layer and the second initial reflective layer distal to the base substrate; and Step S113: etching the initial isolation layer and the first initial reflective layer from a side of the initial isolation layer distal to the first initial reflective layer to form the first reflective layer.

The structure obtained after the execution of step S111 is shown in FIG. 4A. Additionally, in step S111, a third initial reflective layer 13 can be formed in the third-color sub-pixel region on the base substrate. The thicknesses of the first initial reflective layer 11', the second initial reflective layer 12' and the third initial reflective layer 13' may be substantially same.

Figure 4B:
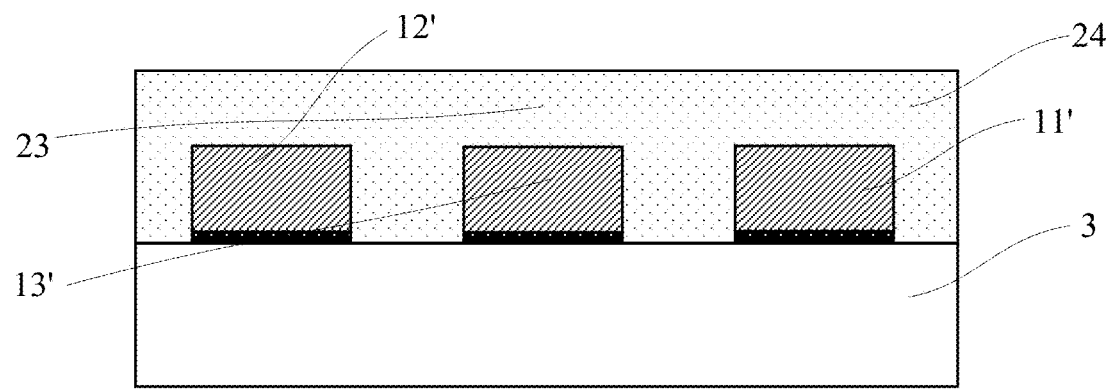

In step S112, as shown in FIG. 4B, the initial isolation layer 24 covers each initial reflective layer and fills the gap between adjacent initial reflective layers. The initial isolation layer 24 may be formed on the reflective layer 10 by a chemical vapor deposition process. The material of the initial isolation layer 24 is, for example, silicon oxide. In step S112, the initial isolation layer 24 may also cover the third initial reflective layer 13'. In the example shown in FIG. 4B, since the thickness of the third reflective layer 13 is greater than the thickness of the first reflective layer 11 and the thickness of the second reflective layer 12, the thickness of the initial isolation layer 24 on the reflective layer 10 may be determined according to the thickness of the third isolation layer 23, and the thickness of the third initial reflective layer 13' can be set to be equal to the thickness of the third reflective layer 13 to be formed, so that the third initial reflective layer 13' can be used directly as the third reflective layer 13 without being etched in the subsequent step. The thickness of the third isolation layer 23 is, for example, 500 to 19500 Angstroms.

Figure 4C:
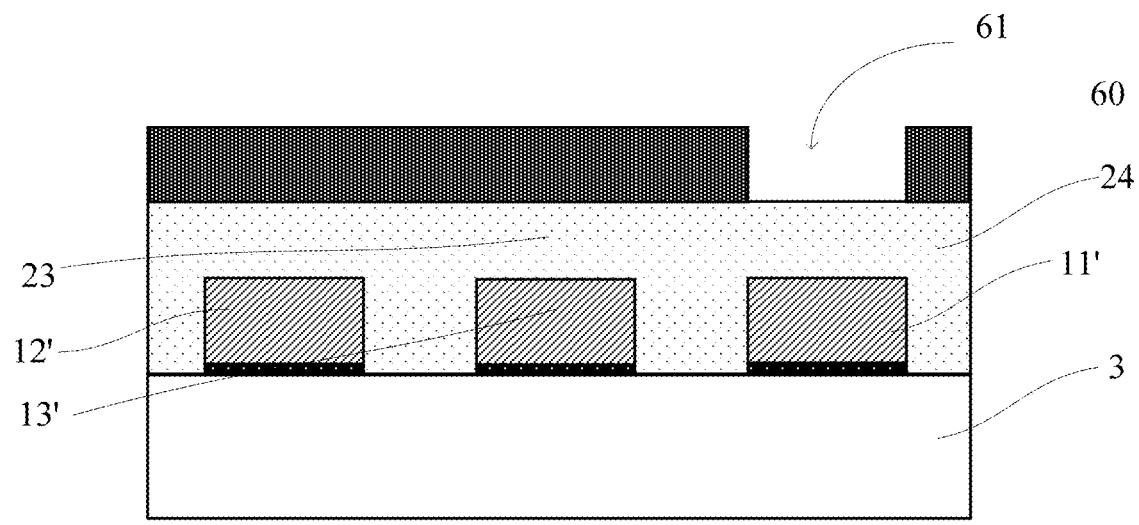
Figure 4D:
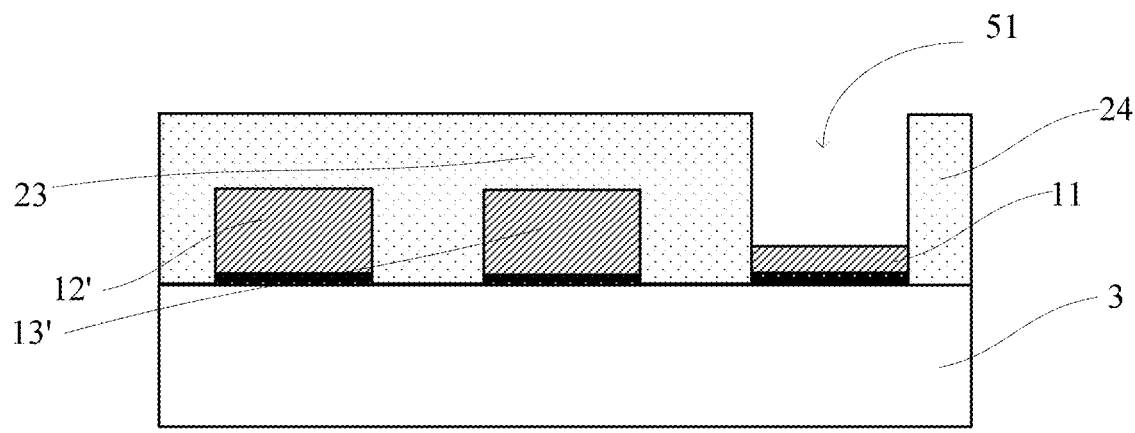

In step S113, as shown in FIG. 4C and FIG. 4D, by etching the initial isolation layer and the first initial reflective layer from a side of the initial isolation layer 24 distal to the first initial reflective layer, a first groove 51 is formed in a predetermined first-color sub-pixel region. The first groove 51 penetrates through the initial isolation layer 24, and at least a portion of the initial reflective layer remains under the first groove 51 to form the first reflective layer 11. The depth of the first groove 51 and the etching depth of the first initial reflective layer 11' are determined by the aforementioned distance H1 between the first reflective layer 11 and the cathode layer 55 and the thickness of the first reflective layer 11.

Specifically, as shown in FIG. 4C, a photoresist layer 60 is coated on the initial isolation layer 24, and an exposed and developed area 61 is formed in the photoresist layer 60 by a photolithography process at a position corresponding to the predetermined first-color sub-pixel region. As shown in FIG. 4D, the first groove 51 is formed by a dry etching process. Specifically, a portion of the initial isolation layer 24 that is above the first initial reflective layer 11' is all etched firstly, and then a portion of the first initial reflective layer 11' under the initial isolation layer 24 is etched according to the requirements of the first-color sub-pixel region (such as the distance H1 between the first reflective layer 11 and the cathode layer 55), so that the remaining portion of the first initial reflective layer 11' forms the first reflective layer 11 corresponding to the first-color sub-pixel region. Finally, the remaining photoresist layer 60 is removed by an ashing process. The thickness of the first reflective layer 11 is 4000 to 22500 Angstroms.

The orthographic projection of the first groove 51 on the base substrate 3 is located within the orthographic projection of the first initial reflective layer 11' on the base substrate 3, so that the etching depth of the first groove 51 may be controlled more precisely, whereby the initial isolation layer 24 on the base substrate 3 may be prevented from being damaged unnecessarily. At the same time, due to the fact that the orthographic projection of the first groove 51 on the base substrate 3 is located within the orthographic projection of the first initial reflective layer 11' on the base substrate 3, the formed microcavity structure is located within the orthographic projection of the first reflective layer 11, whereby the light can be superimposed more effectively.

In some embodiments, step S110 may further include:

Step S114: etching the initial isolation layer and the second initial reflective layer from a side of the initial isolation layer distal to the second initial reflective layer to form the second reflective layer, wherein the etching depth of the second initial reflective layer is different from the etching depth of the first initial reflective layer.

Figure 4E:
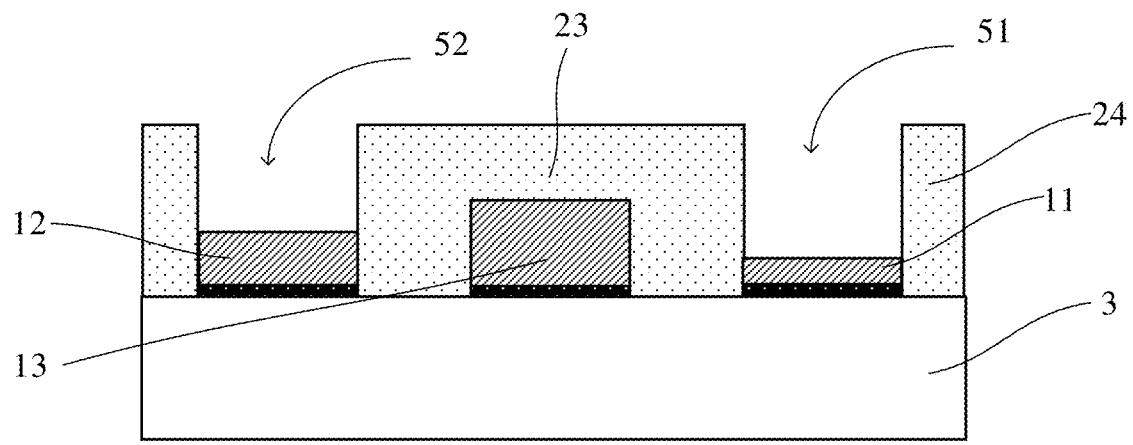

In step S114, as shown in FIG. 4E, by etching the initial isolation layer 24 and the second initial reflective layer 12' from a side of the initial isolation layer 24 distal to the second initial reflective layer 12', a second groove 52 is formed in a predetermined second-color sub-pixel region. The second groove 52 penetrates through the initial isolation layer 24, and at least a portion of the initial reflective layer remains under the second groove 52 to form the second reflective layer 12. The depth of the second groove 52 and the etching depth of the second initial reflective layer 12' are determined by the aforementioned distance H2 between the second reflective layer 12 and the cathode layer 55 and the thickness of the second reflective layer 12.

That is, similarly to step S113, a photoresist layer 60 is coated on the initial isolation layer 24, and an exposed and developed area 61 is formed in the photoresist layer 60 by a photolithography process at a position corresponding to the second-color sub-pixel region. The second groove 52 is formed by a dry etching process. Specifically, a portion of the initial isolation layer 24 that is above the second initial reflective layer 12' is all etched firstly, and then a portion of the second initial reflective layer 12' under the initial isolation layer 24 is etched, so that the remaining portion of the second initial reflective layer 12' forms the second reflective layer 12. Finally, the remaining photoresist layer 60 is removed by an ashing process. The difference from Step 123 lies in that: according to the requirements of the second-color sub-pixel (such as the distance H2 between the second reflective layer 12 and the cathode layer 55), a portion of the second initial reflective layer 12' under the initial isolation layer 24 is etched, and the second reflective layer 12 corresponding to the second-color sub-pixel region is thus formed. The thickness of the second reflective layer 12 is, for example, 4,000 to 22500 Angstroms.

Similarly, the orthographic projection of the second groove 52 on the base substrate 3 is located within the orthographic projection of the second initial reflective layer 12' on the base substrate 3, so that the etching depth of the second groove 52 may be controlled more precisely, whereby the initial isolation layer 24 on the base substrate 3 may be prevented from being damaged unnecessarily. At the same time, due to the fact that the orthographic projection of the second groove 52 on the base substrate 3 is located within the orthographic projection of the second initial reflective layer 12' on the base substrate 3, the formed microcavity structure is located within the orthographic projection of the second initial reflective layer 12', whereby the light can be superimposed more effectively.

Figure 3C:
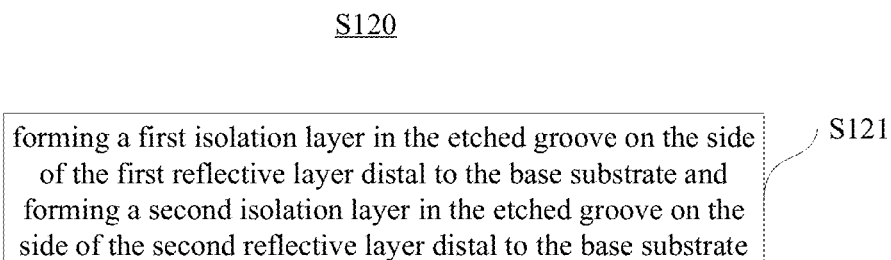
FIG. 3C is a schematic flowchart of step S120 in FIG. 3A.

In some embodiments, as shown in FIG. 3C, step S120 may include:

Step S121: forming a first isolation layer in the etched groove on the side of the first reflective layer distal to the base substrate and forming a second isolation layer in the etched groove on the side of the second reflective layer distal to the base substrate.

Figure 4F:
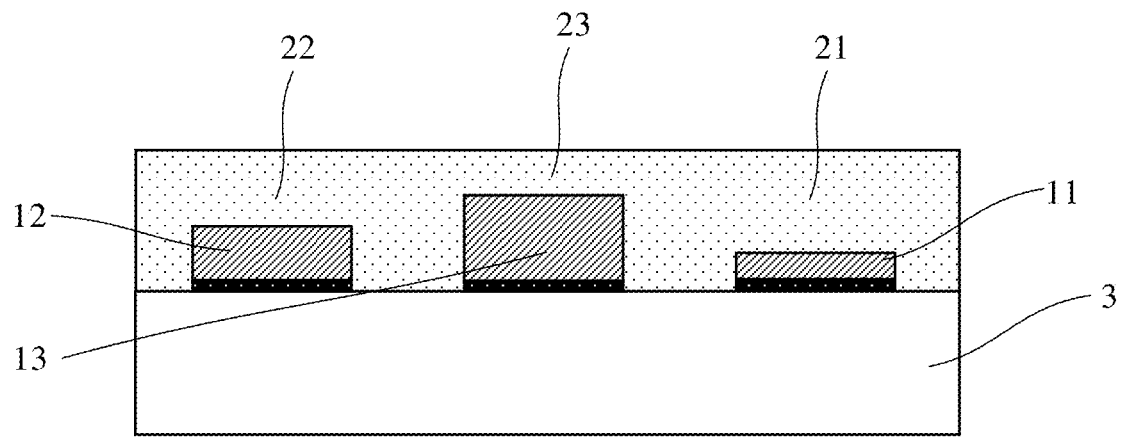

In step S121, as shown in FIG. 4F, the first isolation layer 21 may be formed in the first groove 51 (i.e., the etched groove) by a chemical vapor deposition process while a second isolation layer 22 is formed in the second groove 52 (i.e., the etched groove) by the same chemical vapor deposition process. The thicknesses of any two of the first isolation layer 21, the second isolation layer 22 and the third isolation layer 23 are not equal to each other. Specifically, the thickness of the first isolation layer 21 is 1500 to 20500 Angstroms; the thickness of the second isolation layer 22 is 1000 to 20000 Angstroms; and the thickness of the third isolation layer 23 is 500 to 19500 Angstroms. In this way, the isolation layers 20 with different thicknesses are arranged to correspond to the sub-pixel regions of different colors, whereby the effect, including increasing the intensity of the emitted light and improving the display brightness, of the microcavity may be further enhanced.

After step S120, and before Step S130, as shown in FIG. 3A, the method includes:

Step S122: flattening the surfaces of the first isolation layer and the second isolation layer distal to the base substrate to make the surface of the first isolation layer distal to the base substrate and the surface of the second isolation layer distal to the base substrate flush with each other.

In the case when the display substrate 2 includes three-color sub-pixels, the surfaces of the first isolation layer, the second isolation layer and the third isolation layer distal to the base substrate may be further flattened, so that any two of the surface of the first isolation layer distal to the base substrate, the surface of the second isolation layer distal to the base substrate and the surface of the third isolation layer distal to the base substrate may be flush with each other.

Figure 4G:
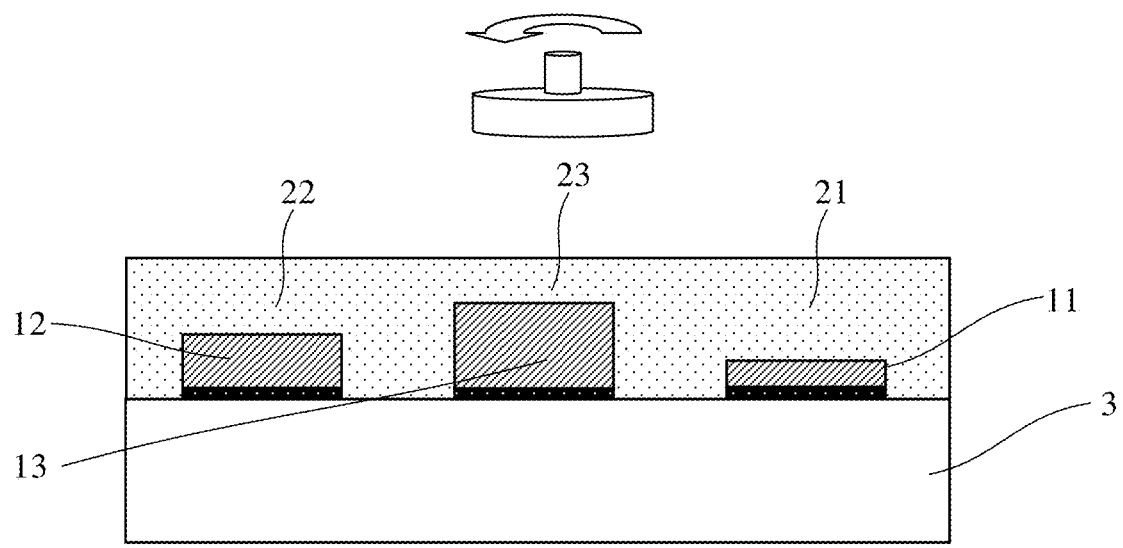

In step S122, as shown in FIG. 4G, the surface of the first isolation layer 21 distal to the base substrate 3, the surface of the second isolation layer 22 distal to the base substrate 3 and the surface of the third isolation layer 23 distal to the base substrate 3 may be flattened by a chemical mechanical polishing process. In this way, through the flattening process, the surface of the first isolation layer 21 distal to the base substrate 3, the surface of the second isolation layer 22 distal to the base substrate 3, and the surface of the third isolation layer 23 distal to the base substrate 3 may be flattened, so that it is possible to avoid breakage of subsequent organic material due to the large height difference of the film, thereby improving the yield of the product and ensuring the quality.

As an example, in step S130, a third connection element 43 penetrating through the third isolation layer 23 may also be formed on the side of the third reflective layer 13 distal to the base substrate 3. Correspondingly, in step S140, a third anode layer 33 may also be formed on the side of the third isolation layer 23 distal to the base substrate 3, and the third anode layer 33 may be electrically connected to the third reflective layer 13 through the third connection element 43.

In some embodiments, as shown in FIG. 3D, Step 130 may include:

Step S131: opening a first connection hole in the first isolation layer, a second connection hole in the second isolation layer, and a third connection hole in the third isolation layer through a single patterning process;

Step S132: forming a first connection element in the first connection hole, forming a second connection element in the second connection hole, and forming a third connection element in the third connection hole through a single patterning process.

Figure 4H:
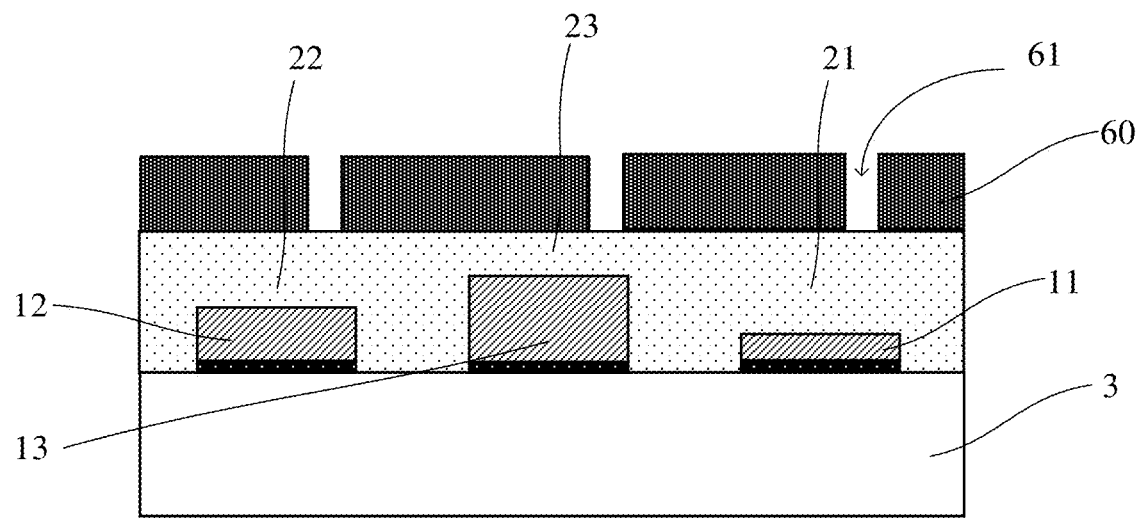
Figure 4I:
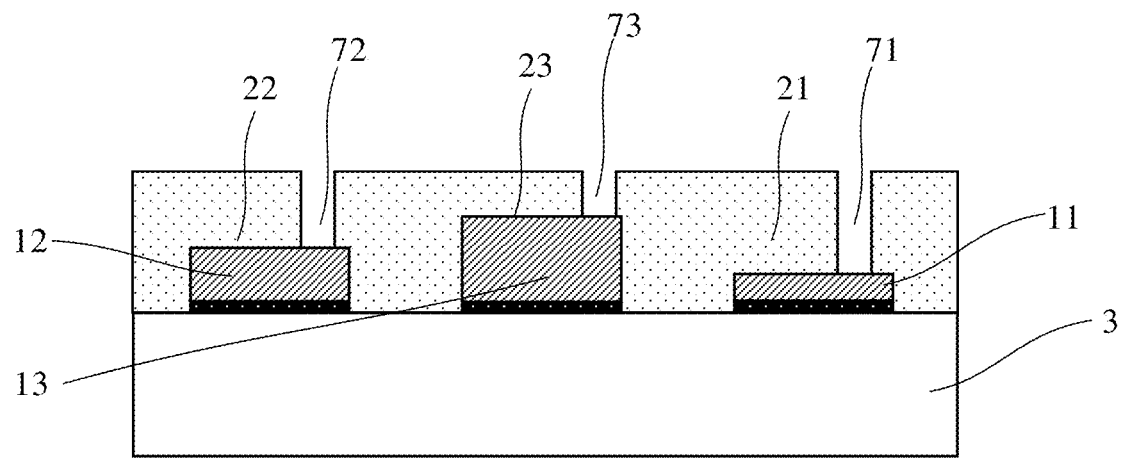

In step S131, as shown in FIG. 4H, a photoresist layer 60 is coated on the isolation layer 20, and exposed and developed regions 61 are formed by a photolithography process in the photoresist layer 60 at the positions corresponding to the first connection hole 71, the second connection hole 72 and the third connection hole 73 which are opened as required. As shown in FIG. 4I, by a single dry etching process, the first isolation layer 21 is etched to form a first connection hole 71, the second isolation layer 22 is etched to form a second connection hole 72, and the third isolation layer 23 is etched to form a third connection hole 73. Then, the remaining photoresist layer 60 is removed by an ashing process. After the previous process of the method according to the present disclosure, the thicknesses of the first reflective layer 11 and the second reflective layer 12 have been adjusted, and thus the surface of the first isolation layer 21 distal to the base substrate 3, the surface of the second isolation layer 22 distal to the base substrate 3, and the surface of the third isolation layer 23 distal to the base substrate 3 are substantially flush. Therefore, it may be avoided to form the first connection hole 71, the second connection hole 72, and the third connection hole 73 in sequence by multiple patterning processes. Rather, the first connection hole 71, the second connection hole 72 and the third connection hole 73 may be formed by a single patterning process, which may simplify the manufacturing steps and improve production efficiency.

Figure 4J:
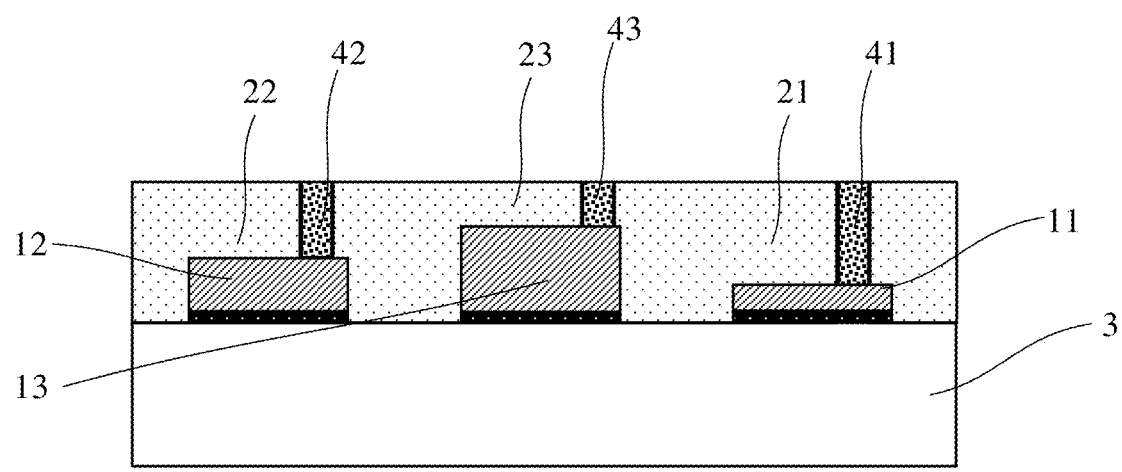

In step S132, as shown in FIG. 4J, simultaneously, a first connection element 41 is formed in the first connection hole 71, a second connection element 42 is formed in the second connection hole 72, and a third connection element 43 is formed in the third connecting hole 73. For example, the first connection element 41, the second connection element 42 and the third connection element 43 have the same structure. In the structure, the peripheral portion in the radial direction is made of titanium metal and the central portion is made of tungsten metal. In other embodiments, the first connection element 41, the second connection element 42 and the third connection element 43 may also have a three-layer structure in the radial direction, including, from its outer part to its inner part, metal titanium, titanium nitride, and tungsten metal.

Also as mentioned above, after the previous manufacturing process of the method according to the present disclosure, the thicknesses of the first reflective layer 11 and the second reflective layer 12 have been adjusted, and thus the surface of the first isolation layer 21 distal to the base substrate 3, the surface of the second isolation layer 22 distal to the base substrate 3, and the surface of the third isolation layer 23 distal to the base substrate 3 are substantially flush. Therefore, it may be avoided to form the first connection element 41, the second connection element 42 and the third connection element 43 in sequence by multiple patterning processes. Rather, the first connection element 41, the second connection element 42, and the third connection element 43 may be formed by a single patterning process.

After step S132, the ends of the first connection element 41, the second connection element 42 and the third connection element 43 distal to the reflective layer 10 may be polished to be flush with the first isolation layer 21, the second isolation layer 22 and the third isolation layer 23.

In step S140, through a single patterning process, a first anode layer may be formed on the first isolation layer, a second anode layer may be formed on the second isolation layer, and a third anode layer may be formed on the third isolation layer.

Figure 4K:
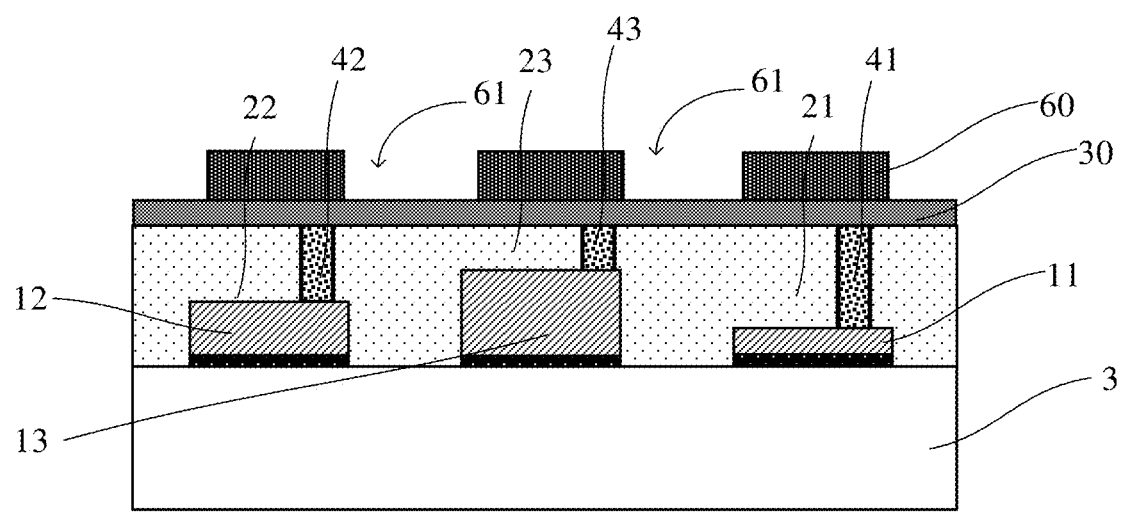
Figure 4L:
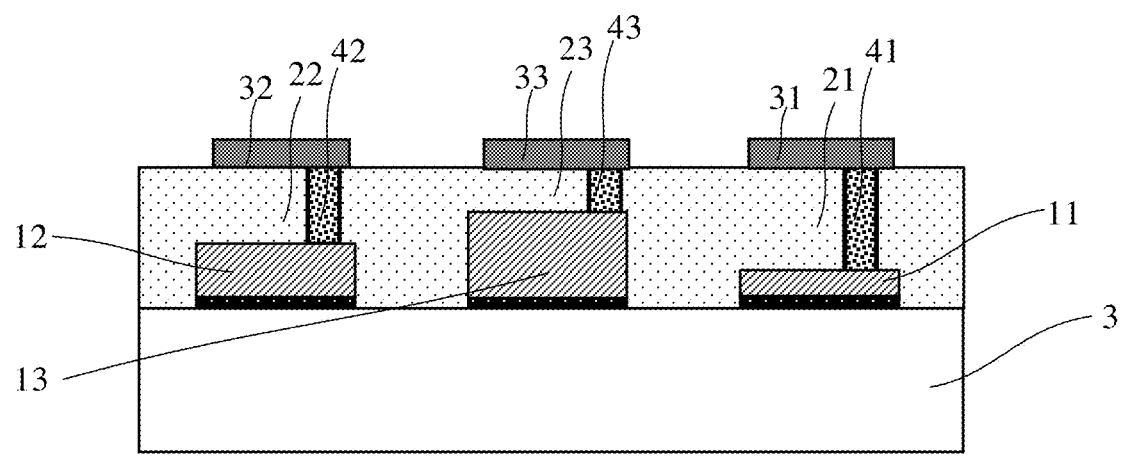

In step S140, as shown in FIG. 4K, after an initial anode layer 30' is grown by physical vapor deposition, a photoresist layer 60 is coated on the initial anode layer 30' firstly. Then, portions of the photoresist layer 60 that correspond to the first anode layer 31, the second anode layer 32, and the third anode layer 33 are left, while other portions of the photoresist layer 60 are exposed and developed to form the areas 61 which will be removed. The anode layer 30 in the exposed and developed area 61 is etched and removed by a dry etching process. Then the remaining portions of the photoresist layer 60 is removed by an ashing process, and a composite anode structure for a microcavity which may be used in a display substrate is obtained, as shown in FIG. 4L. The material of the anode layer 30 is a transparent material. Specifically, the material of the anode layer 30 (such as the first anode layer 31, the second anode layer 32, the third anode layer 33) is, for example, indium tin oxide. The thickness of the anode layer 30 is, for example, 100 to 2000 Angstroms.

In some embodiments, the orthographic projection of the anode layer 30 (e.g., the first anode layer 31, the second anode layer 32, the third anode layer 33) on the base substrate 3 may be located within the orthographic projection of the corresponding reflective layer 10 (e.g., the first reflective layer 11, the second reflective layer 12, the third reflective layer 13) on the base substrate 3. Therefore, the light incident into composite anode structure 1 for the microcavity through the anode layer 30 may be controlled to be reflected by the reflective layer 10 better, so as to enhance the intensity of the emitted light by means of the optical interference and thus achieve the beneficial effect of increasing brightness.

The manufacturing method of the display substrate in this embodiment has a simple preparation process, which would minimize the number of the required photomask processes. Additionally, the fabricated composite anode structure for a microcavity has a flat surface, which is beneficial to subsequent organic material evaporation processes.

In the above exemplary embodiment of the present disclosure, a display substrate having sub-pixels of three colors is used as an example for description. However, embodiments of the present disclosure are not limited thereto. For example, a display substrate according to an embodiment of the present disclosure may have sub-pixels of two, four or more colors. Accordingly, these display substrates may also have two, four or more types of composite anode structures. These display substrates can be designed and manufactured by applying the technical concepts described in the present disclosure, which also belongs to the protection scope of the present application.

The above are merely exemplary embodiments of the present disclosure, and are not intended to limit the present application. Any modification, equivalent replacement, or improvement made within the spirit and principle of the present application shall fall within the protection scope of the present application.

What is claimed is:

1. A display substrate comprising:
    a base substrate;
    a first-color sub-pixel region and a second-color sub-pixel region provided on the base substrate;
    wherein the first-color sub-pixel region comprises:
        a first reflective layer;
        a first isolation layer on a side of the first reflective layer distal to the base substrate; and
        a first anode layer on a side of the first isolation layer distal to the base substrate, the first reflective layer and the first anode layer being electrically connected with each other through a first connection element which penetrates through the first isolation layer;
    wherein the second-color sub-pixel region comprises:
        a second reflective layer;
        a second isolation layer on a side of the second reflective layer distal to the base substrate; and
        a second anode layer on a side of the second isolation layer distal to the base substrate, the second reflective layer and the second anode layer being electrically connected with each other through a second connection element which penetrates through the second isolation layer; and
    wherein thicknesses of the first isolation layer and the second isolation layer are different.

2. The display substrate according to claim 1, wherein thicknesses of the first reflective layer and the second reflective layer are different.

3. The display substrate according to claim 1, wherein a surface of the first isolation layer distal to the first reflective layer and a surface of the second isolation layer distal to the second reflective layer are flush with each other.

4. The display substrate according to claim 1, further comprising a third-color sub-pixel region on the base substrate,
   wherein the third-color sub-pixel region comprises a third reflective layer, a third isolation layer on a side of the third reflective layer distal to the base substrate, and a third anode layer on a side of the third isolation layer distal to the base substrate, the third reflective layer and the third anode layer being electrically connected with each other through a third connection element which penetrates through the third isolation layer; and
   wherein thicknesses of any two of the first isolation layer, the second isolation layer and the third isolation layer are not equal to each other.

5. The display substrate according to claim 4, wherein a thickness of the first isolation layer is 1500 to 20500 Angstroms, a thickness of the second isolation layer is 1000 to 20000 Angstroms, and a thickness of the third isolation layer is 500 to 19500 Angstroms.

6. The display substrate according to claim 4, wherein thicknesses of any two of the first reflective layer, the second reflective layer and the third reflective layer are different from each other.

7. The display substrate according to claim 6, wherein any two of a sum of thicknesses of the first isolation layer and the first reflective layer, a sum of thicknesses of the second isolation layer and the second reflective layer, and a sum of thicknesses of the third isolation layer and the third reflective layer are equal.

8. The display substrate according to claim 6, wherein a thickness of the first reflective layer is 4000 to 22500 Angstroms, a thickness of the second reflective layer is 4500 to 23000 Angstroms, and a thickness of the third reflective layer is 5000 to 23500 Angstroms.

9. The display substrate according to claim 1, wherein the first reflective layer and the second reflective layer each comprises a protective sub-layer and a reflective sub-layer that are stacked, and the reflective sub-layer is located on a side of the protective sub-layer distal to the base substrate.

10. The display substrate according to claim 9, wherein the protective sub-layer is made of titanium metal, and the reflective sub-layer is made of aluminum metal.

11. The display substrate according to claim 1, wherein the first anode layer and the second anode layer are made of indium tin oxide.

* * * * *